(12) United States Patent
Du-Nour

(10) Patent No.: US 6,801,321 B1
(45) Date of Patent: Oct. 5, 2004

(54) METHOD AND APPARATUS FOR MEASURING LATERAL VARIATIONS IN THICKNESS OR REFRACTIVE INDEX OF A TRANSPARENT FILM ON A SUBSTRATE

(75) Inventor: Ofer Du-Nour, Timrat (IL)

(73) Assignee: Tevet Process Control Technologies Ltd., Moshava Yokneam (IL)

( * ) Notice: Subject to any disclaimer, the term of this patent is extended or adjusted under 35 U.S.C. 154(b) by 0 days.

(21) Appl. No.: 09/762,473

(22) PCT Filed: Aug. 26, 1999

(86) PCT No.: PCT/IL99/00466

§ 371 (c)(1),
(2), (4) Date: Feb. 7, 2001

(87) PCT Pub. No.: WO00/12958

PCT Pub. Date: Mar. 9, 2000

(30) Foreign Application Priority Data

Aug. 27, 1998 (IL) .............................. 125964

(51) Int. Cl.[7] .............................................. G01B 9/02
(52) U.S. Cl. ...................................... 356/504; 356/517
(58) Field of Search .............................. 356/485, 492, 356/497, 503, 504, 517, 632

(56) References Cited

U.S. PATENT DOCUMENTS

| | | | |
|---|---|---|---|
| 4,660,979 A | | 4/1987 | Muething |
| 4,787,749 A | | 11/1988 | Ban et al. |
| 4,841,156 A | | 6/1989 | May et al. |
| 4,909,631 A | * | 3/1990 | Tan et al. ................ 356/504 |
| 4,984,894 A | * | 1/1991 | Kondo ..................... 356/504 |
| 5,227,861 A | * | 7/1993 | Nishizawa et al. ......... 356/497 |
| 5,381,442 A | | 1/1995 | Brown et al. |
| 5,450,205 A | | 9/1995 | Sawin et al. |
| 5,600,441 A | | 2/1997 | de Groot et al. |
| 5,744,814 A | | 4/1998 | Uchiyama |

FOREIGN PATENT DOCUMENTS

| | | |
|---|---|---|
| EP | 756318 | 1/1997 |
| JP | 071804 | 4/1987 |
| JP | 304304 | 12/1989 |
| JP | 294220 | 11/1995 |

OTHER PUBLICATIONS

Prabhaker S. Naidu, *Modern Spectrum Analysis of Time Series*, CRC Press 1996.

* cited by examiner

*Primary Examiner*—Samuel A. Turner
(74) *Attorney, Agent, or Firm*—G.E. Ehrlich (1995) Ltd.

(57) ABSTRACT

A method or apparatus for measuring lateral variations of a property such as thickness or refractive index of a transparent film on a semiconductor, in a region of repeated patterning comprises: illuminating over the patterned area with a beam of light of multiple wavelengths, the beam having dimensions to include repeated patterning; detecting the intensity of light reflected over the patterned area for each wavelength; producing a signal defining the variation of the intensity of the detected light as a function of the wavelength of the detected light; decomposing the signal into principal frequencies thereof, determining from the principal frequencies, values of the thickness etc. of the transparent film; and applying the values to repetitions within the repeated patterning.

34 Claims, 12 Drawing Sheets

METHOD AND APPARATUS FOR MEASURING LATERAL VARIATIONS IN THICKNESS OR REFRACTIVE INDEX OF A TRANSPARENT FILM ON A SUBSTRATE

FIELD AND BACKGROUND OF THE INVENTION

The present invention relates to a method and apparatus for measuring the thickness or the refractive index of a transparent film on a substrate. The invention is particularly useful in measuring thickness variations of a photoresist film on a semiconductor substrate, and is therefore described below with respect to this application.

A typical semiconductor manufacturing process uses more than 17 photolithography steps. In each step, a photoresist (PR) material is deposited on the semiconductor (e.g., silicon wafer) surface, and an optical process is used to copy patterns onto the PR. The patterned PR is then used as a masking layer for subsequent process steps, such as etching, implanting, depositing, scribing, grinding, etc.

A photolithography process includes the following steps:
a) film, wherein the PR layer is coated uniformly over the wafer,
b) baking, wherein the PR is baked at a moderate temperature to dry the solvents therein;
c) exposing, wherein the wafer is exposed through a mask in which the required pattern appears as a non-transparent printing;
d) developing, wherein a chemical process is applied to remove the exposed PR from the wafer, and.
e) post exposure baking, wherein the wafers are baked after the exposure in order to harden the photoresist.

The photolithography process is one of the most challenging technologies used in the semiconductor industry. The patterns printed in the critical layers set the dimensional limitations for the entire technology. The minimum line width achieved today in production is 0.18 $\mu$m (1/1,000 mm); the next generation of technologies is expected to require minimum line width of 0.1 $\mu$m and below.

To achieve the minimum line width with high uniformity within each wafer and from wafer to wafer, it is most important to control each and every parameter in the photolithography process. Exposure energy, PR chemical composition, development time and baking temperature are only a few of the parameters that can affect the final critical dimension (CD) and its uniformity.

One of the most critical parameters to be controlled is the PR thickness. Because of the optical nature of photolithography, fluctuations of several nano-meters in the layer thickness can have a substantial effect on the final CD.

In the current processes, the PR film is applied on a high speed spinning chuck, called a "spinner". The wafer is placed on the spinning chuck and is rotated at low speed while the PR is dispensed at the center of the wafer. After dispensing, the chuck is rotated at a high speed (300–5000 RPM). The centrifugal forces acting on the PR cause the PR liquid to flow towards the edge of the wafer. Most of the PR (ca. 95%) is spilled off the wafer and is collected in a bowl to be drained later. The adhesion forces between the wafer surface and the PR hold a smaller amount of the PR on the wafer. The final thickness is a function of the centrifugal forces, the adhesion to the surface, and the shear forces caused by the viscosity of the liquid. The viscosity is increased during the spin due to the solvents evaporation therefore the solvents evaporation rate affects also the final thickness.

To control the final thickness one should control the rotational speed, the ramp-up speed ("acceleration"), the PR viscosity, and the environmental conditions within the bowl, among other parameters.

After spinning, the wafer is transferred to sit on a hot plate to perform the pre-exposure bake. Solvent evaporation during the bake further reduces the PR thickness. Nonuniformity of the hot plate temperature can cause nonuniformity of the final thickness.

Today, the process is set up and controlled by running a bare silicon test wafer and measuring the final thickness, and thickness uniformity, by a stand-alone layer-thickness measurement device. In order to ensure process stability, a periodic test is done on the test wafer. If the thickness drifts out of the control limits, the production is stopped and corrective actions are taken to bring the final thickness back to target.

The above-described thickness monitoring procedures are inefficient and wasteful. They can cause serious delays in reacting to a process out of control (OOC)-Test wafers and PR, as well as operational and engineering time, are spent in running the tests in a stand-alone system. Machine operational time is also wasted when the processing of production wafers is held up until positive test results are obtained. If the test results are negative, reworking may be required, or a complete batch may have to be scrapped.

Moreover, in contrast to the test wafers used for measurement purposes, the real production wafers have a much more complicated topography below the PR layer. As can be seen from a comparison of FIG. 1$a$ to FIG. 1$b$, there may be a large difference in the thickness at different places (d1–d2), which differences are not reflected in a flat test wafer measurement.

In addition, since most of the PR ends up in the bowl, a considerable quantity of PR material is wasted. PR is one of the most expensive materials in the semiconductor process and will probably be even more expensive when deep-UV lithography is implemented in future production processes.

SUMMARY OF THE INVENTION

An object of the present invention is to provide an improved method and apparatus for measuring the lateral variation of the thickness of a transparent film on a production wafer. Another object is to provide a method and apparatus which are particularly useful in measuring lateral thickness variations in photoresist films on semiconductor substrates to avoid many of the above described drawbacks in the existing method and apparatus.

According to one broad aspect of the present invention, there is provided a method of measuring lateral variations of a property, selected from the group consisting of thickness and refractive index, of a transparent film on a substrate, including the steps of: (a) illuminating the film with a beam of light of multiple wavelengths; (b) detecting the intensity of the light reflected from the transparent film for each wavelength; (c) producing a signal defining the variation of the intensity of the detected light as a function of the wavelength of the detected light; (d) decomposing the signal into principal frequencies thereof; and (e) determining from the principal frequencies the lateral variations of the property of the transparent film.

According to another broad aspect of the present invention, there is provided an apparatus for measuring lateral variations of a property, selected from the group consisting of thickness and refractive index, of a transparent film on a substrate, including: (a) an illuminating device for illuminating the film with a beam of light of multiple wavelengths; (b) a detector for detecting the intensity of the light reflected from the transparent film for each wavelength; and (c) a processor for: (i) producing a signal defining the variation of the intensity of the detected light as a function of the wavelength of the detected light, (ii) decomposing the signal into principal frequencies thereof, and (iii) determining, from the principal frequencies, the lateral variations of the property of the transparent film.

According to another aspect of the present invention, there is provided, in a process for fabricating integrated circuits on a wafer, wherein trenches are formed on a surface of the wafer and the surface then is covered with an oxide layer that fills the trenches, a method of measuring depths of the trenches, including the steps of: (a) illuminating at least a portion of the oxide layer with a beam of light of multiple wavelengths; (b) detecting the intensity of the light reflected from the oxide layer for each wavelength; (c) producing a signal defining the variation of the intensity of the detected light as a function of the wavelength of the detected light; (d) decomposing the signal into principal frequencies thereof; and (e) determining the depths of the trenches from the principal frequencies.

According to further features in the preferred embodiment of the invention described below, the film is a transparent coating on a semiconductor substrate, preferably on a die among a plurality of dies carried on a semiconductor wafer. As will be described below, a number of advantages are obtained when the beam of light is large enough to cover a complete die.

According to another aspect of the present invention, there is provided apparatus for measuring the thickness of a transparent film on the substrate in accordance with the above method.

As will also be described below, the method and apparatus of the present invention are particularly useful for measuring thickness variations or refractive index variations of a film in situ, and in real time, e.g., to control the deposition or removal of a layer on a semiconductor substrate.

Further features and advantages of the invention will be apparent from the description below.

BRIEF DESCRIPTION OF THE DRAWINGS

The invention is herein described, by way of example only, with reference to the accompanying drawings, wherein:

FIG. 6 is a flow chart of the measurement sequence in the apparatus of FIG. 3a;

DESCRIPTION OF THE PREFERRED EMBODIMENTS

Basic Theory of Operation

Figure 1A:
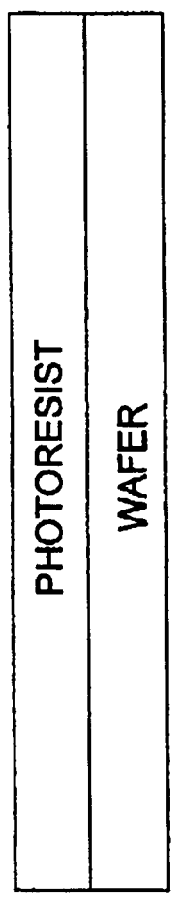
FIG. 1a is a schematic illustration of a PR layer on top of a flat test wafer.
Figure 1B:
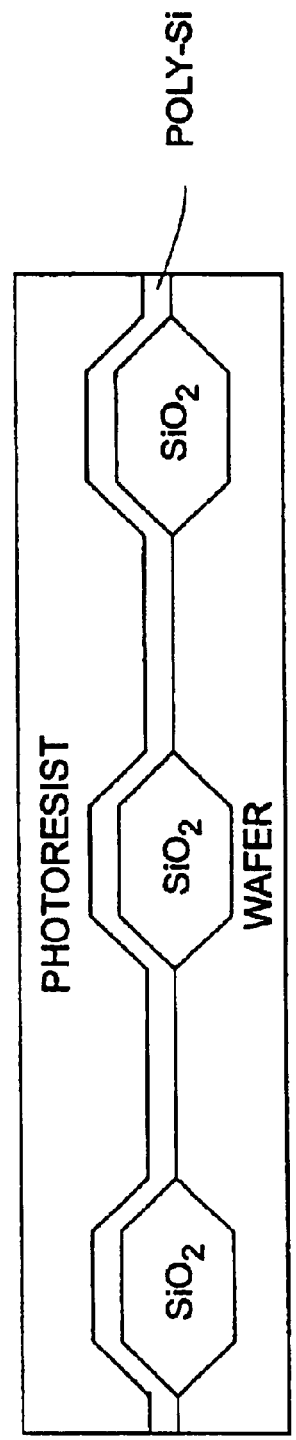
FIG. 1b is a schematic illustration of a PR layer on top of a patterned wafer.

As indicated above, the method and apparatus of the present invention are particularly suitable for measuring the thickness of a transparent film, particularly a photoresist coating, where there are differences in thickness at different places of the substrate, as illustrated in FIG. 1. Thus, FIG. 1 illustrates two different layer thickness $d_1$–$d_2$ in a typical wafer. These differences in thickness would not be accurately measurable in a conventional measurement. The method and apparatus of the present invention, however, are capable of measuring such thickness variations in applied or removed, in situ and in real-time. The following description of the basic theory of operation of the present invention will be helpful in understanding how this is done.

Several methods are known for measuring thickness of laterally uniform transparent films using the reflected pattern of multi-wavelength light. Thus, as shown in FIG. 2, when a monochromatic (single wavelength) light beam arrives at a laterally uniform transparent film, part of the beam is reflected from the upper face (Layer 0/Layer 1 interface), and part is reflected from the bottom face (Layer 1/Layer 2 interface).

Figure 2:
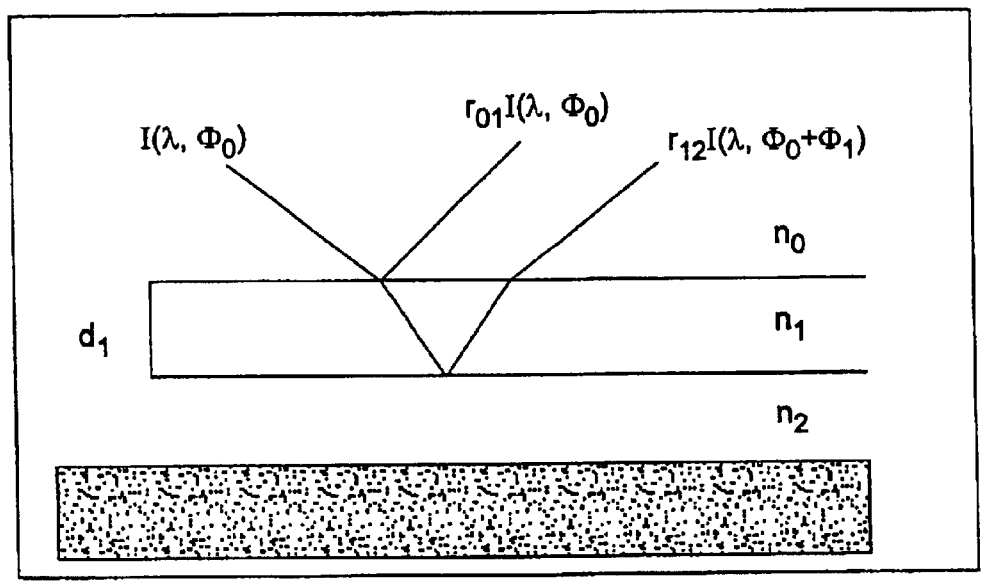
FIG. 2 is a diagram illustrating the reflectance diffraction of a thin layer, which diagram will be referred to in describing the basic theory of the present invention.

FIG. 2 illustrates the above, wherein:

λ is the wavelength of the light;

$\phi_0$ is the phase angle of the incident light (and of the light reflected from the Layer 0/Layer 1 interface):

$\phi_0+\phi_1$ is the phase angle of the light reflected from the Layer 1/Layer 2 interface, $\phi_1$ being the phase difference associated with propagation of the light through Layer 1;

$r_{01}$ is the reflection coefficient of the Layer 0/Layer 1 interface;

$r_{12}$ is the reflection coefficient of the Layer 1/Layer 2 interfaces; and

I is the intensity of the incident light $$I=I_0 \cos(2\pi ct/\lambda+\phi_0) \quad \text{(EQ. 1)}$$

Where $I_0$ is the intensity amplitude and c is the speed of light

For light arriving perpendicularly to the film surface, the reflection coefficient from the top and bottom surfaces are:

$$r_{01}=(n_1-n_0)/(n_1+n_0) \quad r_{12}=(n_2-n_1)/(n_2+n_1) \quad \text{(EQ. 2)}$$

wherein $n_0$, $n_1$, $n_2$ are the refractive indices of layers 0,1 and 2, respectively.

The light reflected from the upper face interferes with the light reflected from the bottom face, giving a reflection coefficient (R) which is a function of the layer thickness and the layer refractive index. This reflection can be described by the, well-known, Fresnel equation.

$$R=(r_{01}^2+r_{12}^2+2r_{01}r_{12}\cos 2\Phi_1)/(1+r_{01}^2r_{12}^2+2r_{01}r_{12}\cos 2\Phi_1) \quad \text{(EQ. 3)}$$

where:

$$\Phi=2\pi n_1 d_1/\lambda \quad \text{(EQ. 4)}$$

$d_1$—layer thickness.

Illumining the film with multi-wavelength light, and measuring the reflectance at each wavelength ($\lambda$), will give R as a function of $\lambda$, i.e., $R(\lambda)$.

Illuminating a product wafer having a complex (i.e., laterally varying) topography with a large spot of multi-wavelength light will cause a reflected beam which is a composition of the separate reflection of each of the thicknesses alone.

$$R(\lambda,d_1,\ldots,d_n)=\Sigma_i\,(r_{(i-1),i}^2+r_{i(i+1)}^2+2r_{(i-1),i}r_{i(i+1)}\cos 2\Phi_i)/(1+r_{(i-1),i}^2r_{i(i+1)}^2+2r_{(i-1),i}r_{i(i+1)}\cos 2\Phi_i) \quad \text{(EQ. 5)}$$

By simple mathematical operations it is possible to express the reflection coefficient by:

$$R(1,d_1,\ldots d_n)=\Sigma_i[1-A/(1+B\cos(2\Phi_i))] \quad \text{(EQ. 6)}$$

Where $$A_i=(1-r_{(i-1),i}^2)(1-r_{i(i+1)}^2)/(1+r_{(i-1),i}^2r_{i(i+1)}^2)$$

$$B_i=2r_{(i-1),i}r_{i(i+1)}/(1+r_{(i-1),i}^2r_{i(i+1)}hu\,2)$$

Applying ways of frequency decomposition of the reflection coefficient can give each of the arguments ($\Phi_i$) and from equations 3 & 4 we can determine the laterally varying layer thickness, assuming that we know the layer refractive index, or the laterally varying layer refractive index, if we know the layer thickness.

There are several ways to perform the frequency decomposition. Some of then are suggested below:

Mathematical decompositions

1) The family of orthogonal transform methods, for example, Fourier transforms
2) The family of methods based on the maximum likelihood principle
3) The family of methods based on Parametric models
4) The family of subspace decomposition methods (cf. Prabbakar S. Naidu, *Modern Spectrum Analysis of Time Series*, CRC Press, 1996)

Electrical decomposition:

1. Filtering Method

Electrical frequency filters are widely used in electrical systems. Those filters act as window in the frequency domain and output the amplitude of the component of the input signal at the specified frequency of the filter. Passing the reflected signal (translated into electrical signal) through a set of filters or a single filter with variable frequency will give the desired decomposition.

2. Correlation Method

This method is a search of significant correlation coefficients during a serial or parallel process correlation between the reflected signals and a set of pure sinusoidal signals.

DESCRIPTION OF A PREFERRED EMBODIMENT

Figure 3A:
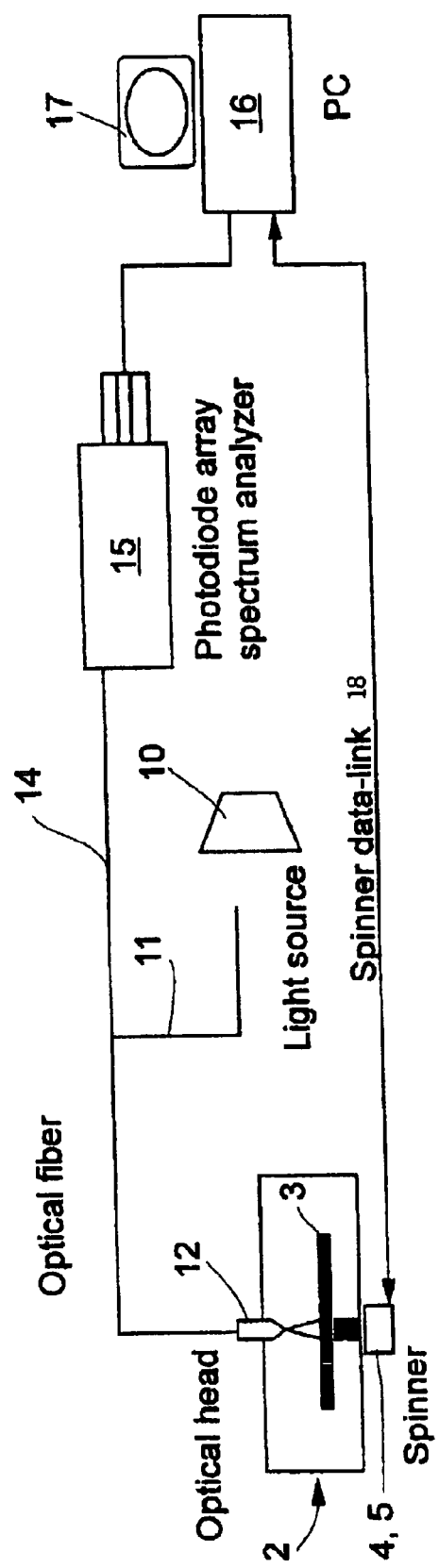
FIG. 3a is a schematic layout of one embodiment of an apparatus of the present invention.
Figure 3B:
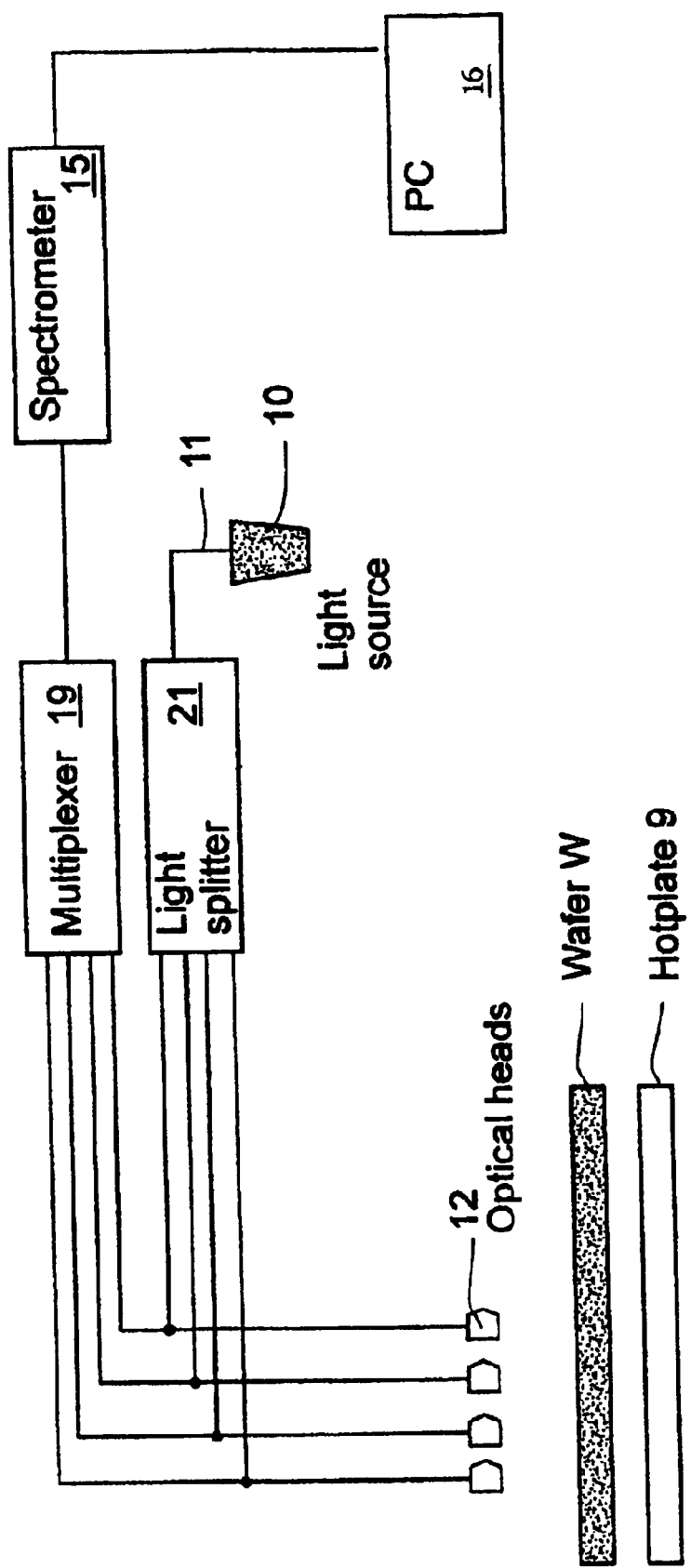
FIG. 3b is a schematic layout of another embodiment of an apparatus of the present invention.
Figure 4A:
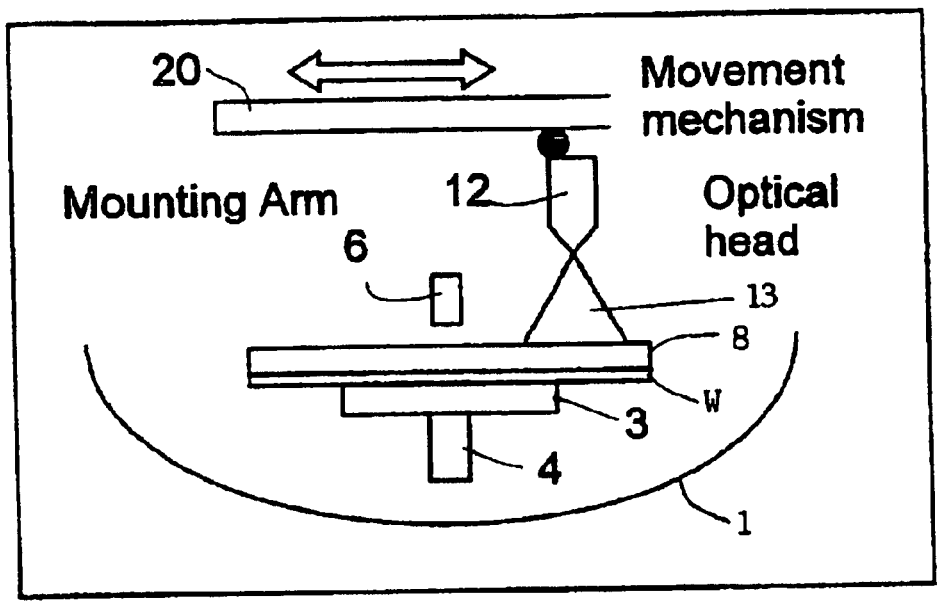
FIGS. 4a and 4b are detailed views of the apparati of FIGS. 3a and 3b, respectively.
Figure 4B:
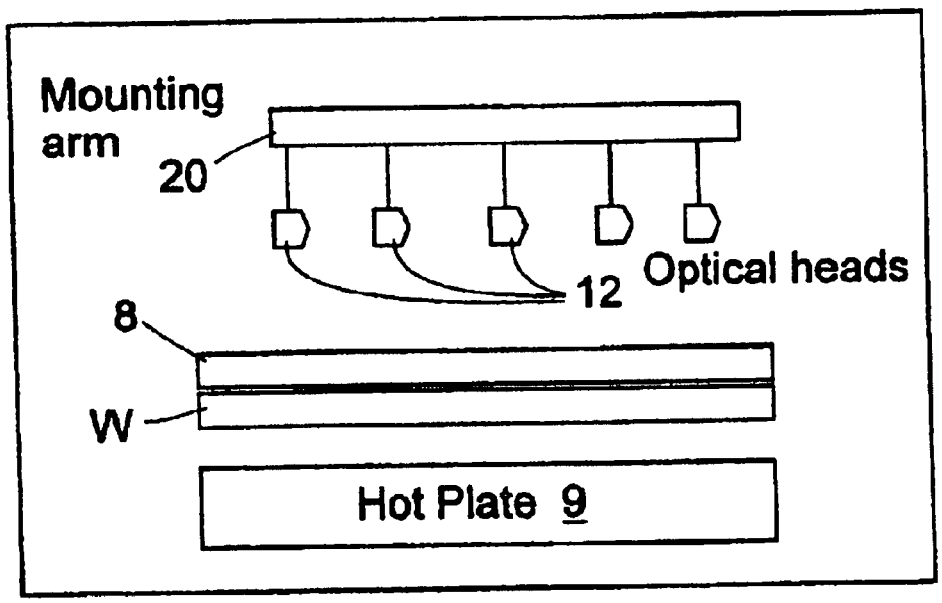
Figure 5A:
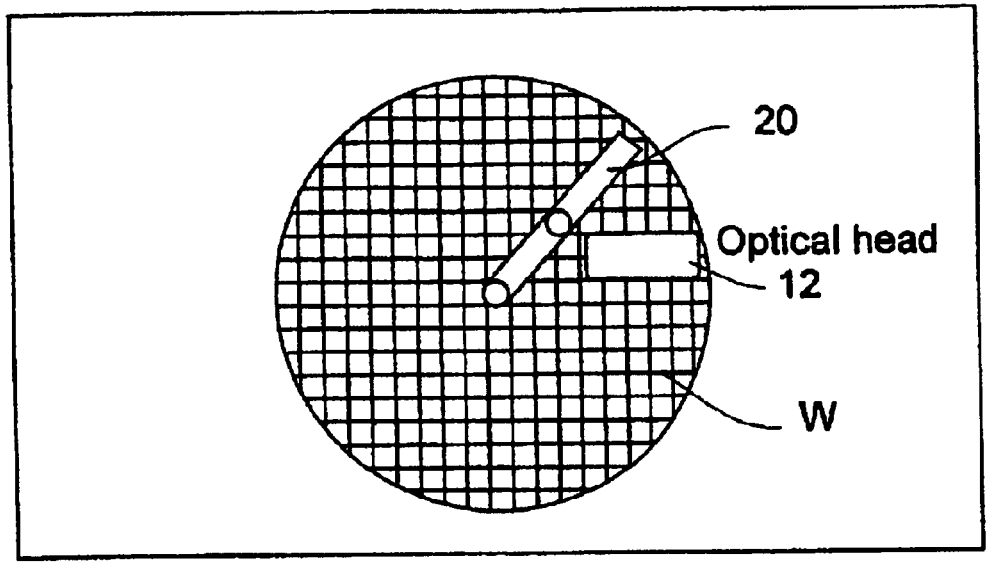
FIGS. 5a and 5b are detailed top views of the apparati of FIGS: 3a and 3b, respectively.

FIGS. 3–5 schematically illustrate two set-ups which may be used for measuring the thickness variations of a transparent layer on a semiconductor substrate in accordance with the present invention. In this example we describe a set-up of the system mounted on a Photoresist coating track. One setup is typical to the spinning bowl and the other is typical to the hot plate. The first set-up includes a spinner system 2, (FIG. 3a), comprising a spinner chuck 3 for receiving the wafer W, and a motor 4 having an encoder 5, for rotating the chuck, and the wafer thereon, while a photoresist applicator 6 (FIG. 4a) dispenses the photoresist material at the center of the wafer. The wafer W is first rotated at a low speed as the photoresist material is dispensed at its center, and then is rotated at a high speed (e.g., 300–5000 rpm) by electric motor 4, which produces centrifugal forces causing the photoresist liquid to flow towards the edge of the wafer W. Most of the photoresist (e.g. about 95%/) is spilled off the wafer and is collected in a bowl 1 (FIG. 4) to be drained later, while the adhesion forces between the wafer surface and the photoresist bold smaller amounts of the photoresist as a coating 8 on the wafer. As briefly described earlier, the final thickness of the photoresist coating 8 is produced when a balance is achieved between the centrifugal forces, the adhesion to the surface, and the shear forces caused by the viscosity of the photoresist liquid. During the spinning process the solvent contained in the photoresist evaporates and the viscosity increases. Therefore the final thickness is also a function of the solvents evaporation rate which is affected by the temperature, air flow and other environmental conditions.

The second set-up describe the hot plate used for further drying of the photoresist following the spin-coating step. In this module the wafer is placed on top a hot plate (9 in FIG. 3b) and left there, for previously set time, for further solvent evaporation of the solvents contents of the photoresist The evaporation causes further reduction of the photoresist thickness.

As illustrated in FIGS. 3–5, the apparatus further includes an illuminating device for illuminating the photoresist coating 8 with a beam of light of multiple wavelengths, preferably infrared, visible or ultraviolet light, and a detector for detecting the intensity of the light reflected from the photoresist coating 8 for each wavelength As is known in the art, the range of wavelengths used should be selected to match the expected lateral variation of the thickness of photoresist coating 8.

The illuminating device is schematically shown at 10 in FIG. 5. It applies a beam of multispectral light in any suitable manner, e.g., via an optical fiber 11, to an optical head 12 mounted above wafer W to project a beam of light 13 onto the photoresist coating 8 of wafer W as wafer W is rotated. The light reflected from the photoresist coating 8 is directed in any suitable manner, e.g., via another optical fiber 14, to a spectrum analyzer 15 for detecting the intensity of the light reflected from photoresist coating 8 for each wavelength.

Figure 5B:
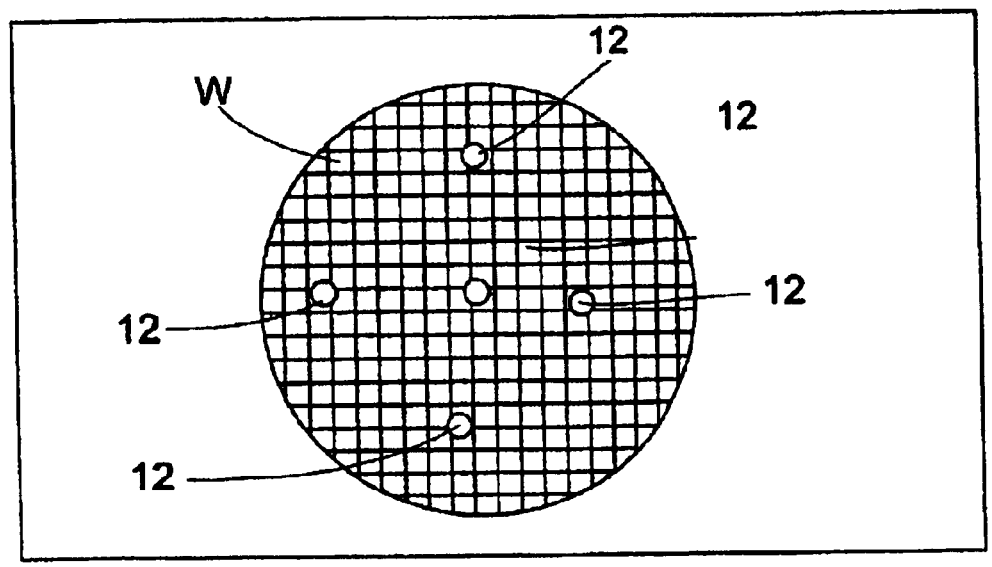

In order to get information on the thickness or refractive index of more then one spot on the wafer, multiple optical heads 12 can be placed at different locations above the wafers (FIGS. 3b 4b & 5b). The probe heads are connected to a multiplexer unit 19. This unit can direct each of the beads separately to the spectrum analyzer 15, by electromechanically switching between each of the optical fibers. Similarly, optical fiber 11 leads to a light splitter 21 which directs the multispectral light from light source 10 to multiple optical heads 12. This setup enables data acquisition from different sites on the wafer.

Spectrum analyzer 15 is schematically illustrated in FIG. 3 as being of the type including a photodiode array. Such an array includes a micro-grating that splits the light beam to its spectral components and a photodiode detector for each wavelength. The outputs of the photodiode array will be in the form of electrical signals representing the intensity of the light reflected from the photocoating for each wavelength.

The outputs of spectrum analyzer 15 are fed to a processor 16 which processors these outputs according to the basic theory of operation described above, and displays the outputs on a screen 17. In addition, an output of processor 16 may also be used for controlling the application of photoresist coating 8 onto wafer W, as shown by the feedback line 18 from processor 16 to the motor 4 of the spinner system. eg. for controlling its rotational speed to control the centrifugal forces applied to the photoresist coating. It will be appreciated, however, that the output from processor 16 could be used for other feed-back controls, e.g., for controlling the rate of application of the photoresist coating to the wafer via applicator 6, or the hot plate temperature.

As shown schematically in FIGS. 4 and 5, optical head 12 is mounted, via an arm 20, for movement along the radial axis, to enable the optical head to be located at any selected radius of the wafer W under test. During the wafer rotation the angular position of wafer W is identified by the encoder 5. This, combined with the radial position, gives the location of the measurement spot on wafer W. In the second example multiple optical heads 12 are mounted on fixed mounting arms to monitor the thickness or refractive index on the wafer below the positions where optical heads 12 are located (FIG. 5b). Preferably, the beam of light 13 is large enough to cover at least one complete die of the plurality of dies carried by wafer W, as schematically shown in FIG. 3. The use of such a beam of light large enough to cover a complete die, or a multiple thereof provides a number of advantages. Thus, it better assures that the combined reflected light detected by detector 15 will not change substantially between measurements, irrespective of the difference in the exact measurement position. Further, the large spot size increases the signal collected by the detector and also increases the speed of detection. Using a large spot size is contrary to the current trends in layer thickness measurement systems which systems use small spot sizes in order to detect different thicknesses.

Figure 6:
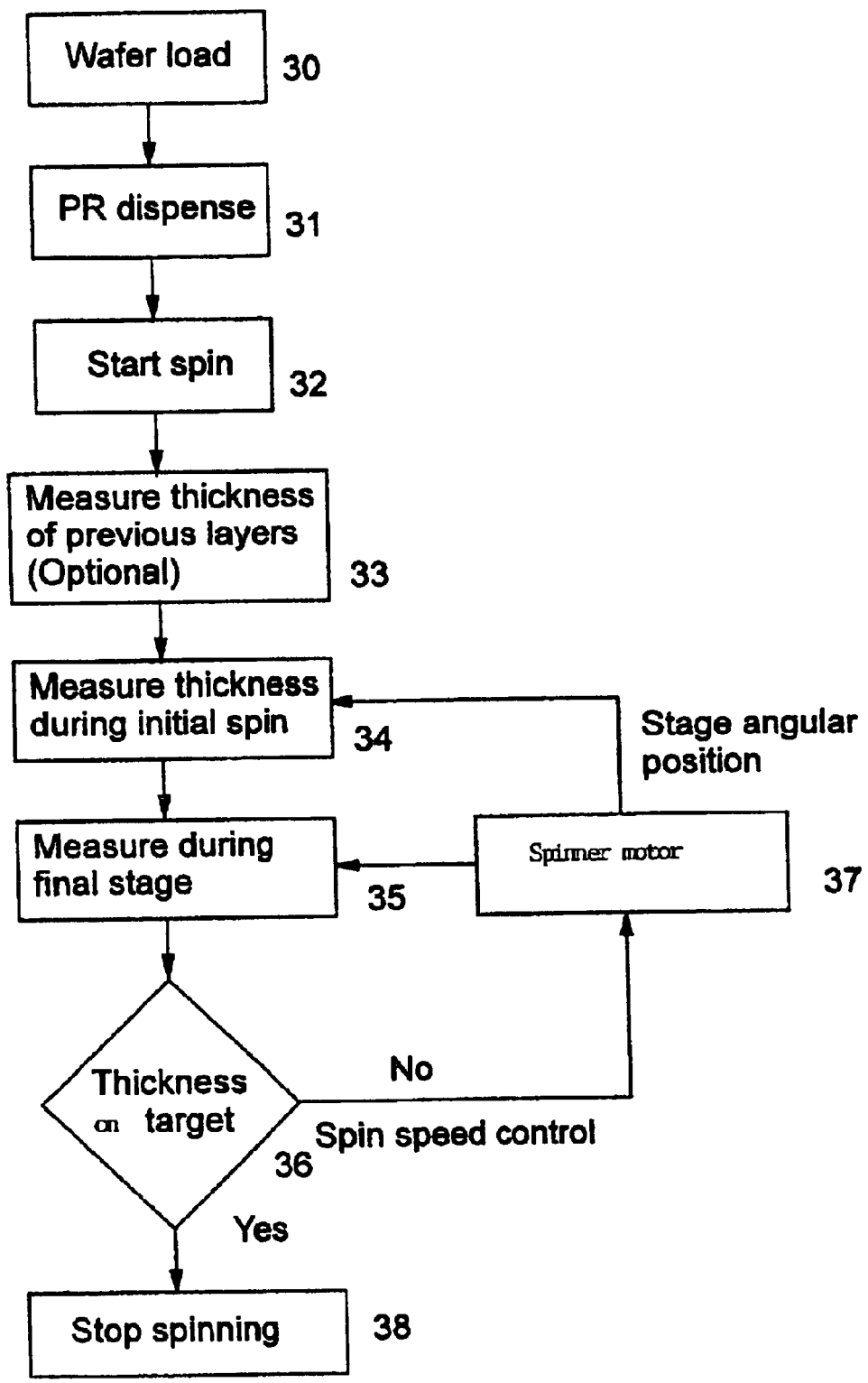

The flow chart of FIG. 6 illustrates one manner of using the above-described apparatus for measuring the thickness of the photoresist coating 8 in situ at the time of application of the photoresist coating, and also for controlling the application of the photoresist coating. As shown in FIG. 6, the wafer W is first loaded on the spinner chuck 3 (block 30). In some of the application a prior knowledge of the thickness of the sublayer is required and will be measured prior to the PR dispense (block 31). Photoresist material is dispensed from the applicator 6 at the center of the wafer (block 32), as the wafer is rotated by the spinner motor 4 (block 33). An initial measurement of the photoresist coating is made (block 34), and subsequent measurements are periodically made (block 35), under the control of the rotary encoder 5 of the spinner motor 4. When the desired thickness is obtained, as determined by processor 16, processor 16 terminates the operation of spinner motor 4, via feed-back line 18 (FIG. 3a). Similar procedure can be applied in the case of the hot plate (FIG. 3b). Processing the reflected signal from the different probe heads gives the thickness or refractive index information from each measurement sites on the wafer. Feeding the information back to the hot plate temperature controller and to the system timer causes real-time feed back on the process and can be used as end-point timer for the baking step.

Figure 7:
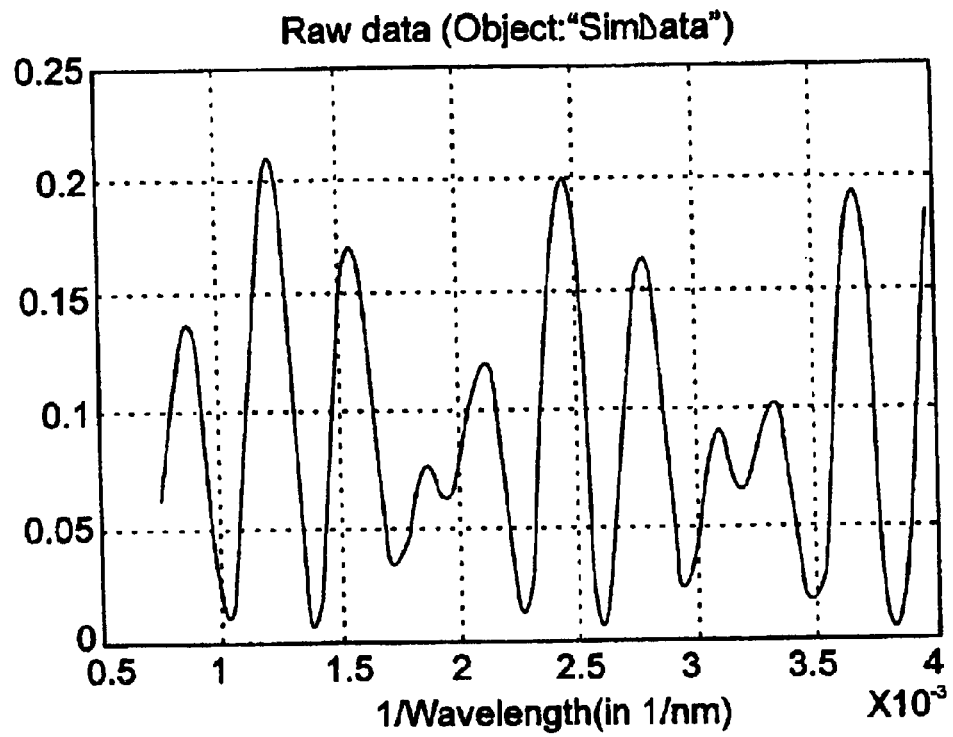
FIG. 7 is a simulated reflection signal for a two thickness case.

FIG. 7 illustrates a simulation of the above-described process when applied to a wafer coated with a photoresist coating of two thicknesses ($d_1$, $d_2$). FIG. 7 thus illustrates the sum R of the reflectance coefficient $R_1$ and $R_2$ as a function of thickness $d_1$ and $d_2$ respectively and the wavelength In this example $d_1=0.95\mu$;$d_2=1.25\mu$, and $f$ (the ratio of the intensity of the separated signals)=1.

Figure 8:
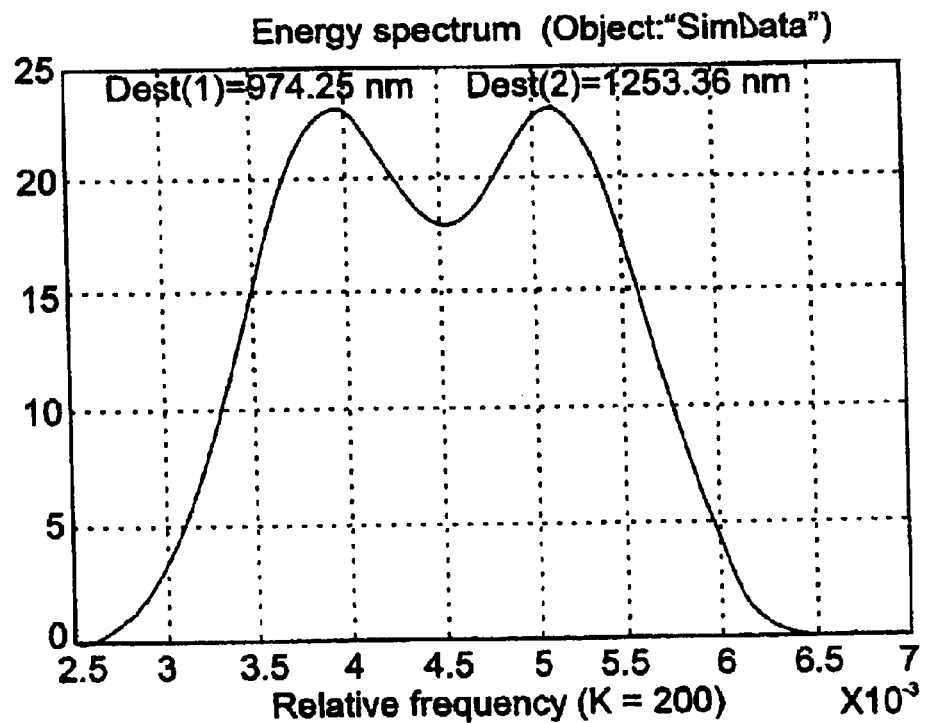
FIG. 8 is the analyzed results of the signal of FIG. 7.

FIG. 8 illustrates the results of applying a Fourier Transformation to the signal R defining the total reflection. This Transformation produces a series of Fourier Coefficients for the signal frequencies, from which the thickness of the transparent film can be determined for each respective signal frequency. As shown in FIG. 8, the two thicknesses of the photoresist coating produced two peaks, each representing a principal frequency related to one of the thicknesses.

Figure 9:
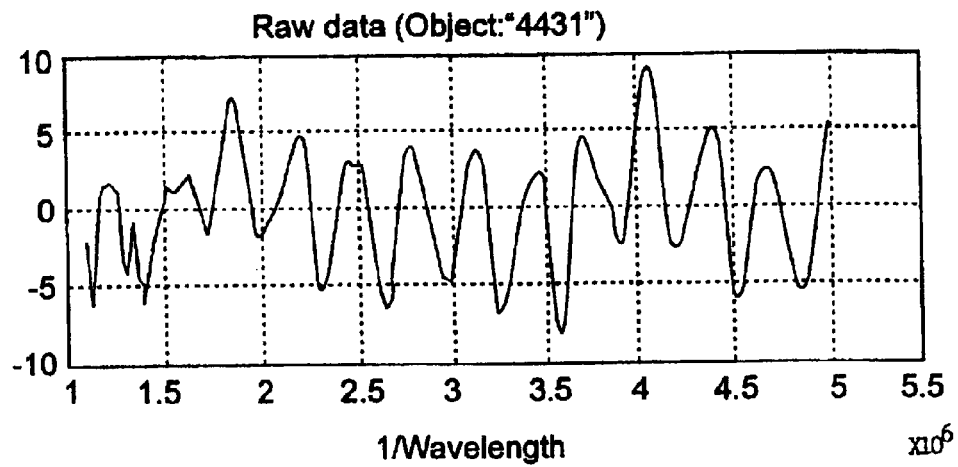
FIG. 9 is a real reflection signal from a wafer with oxide on top of metal lines and intermetal dielectric.
Figure 10:
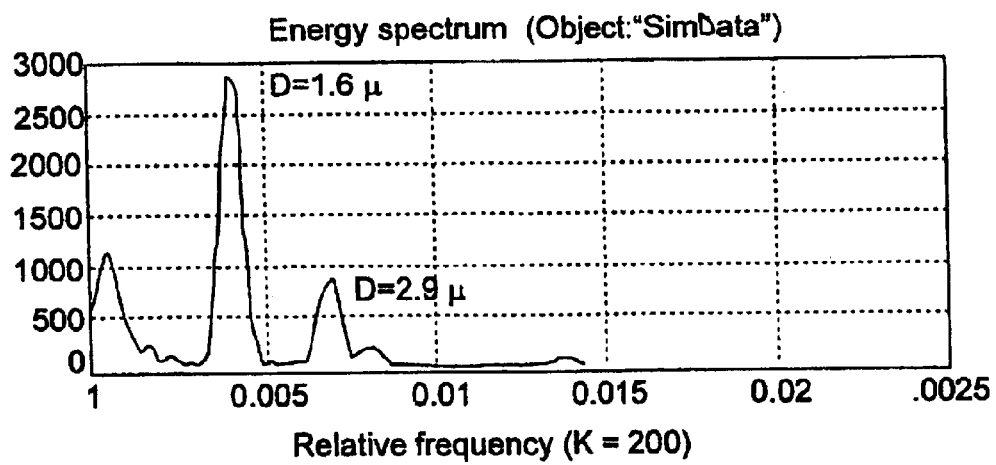
FIG. 10 is the analysis of the signal of FIG. 9.
Figure 11:
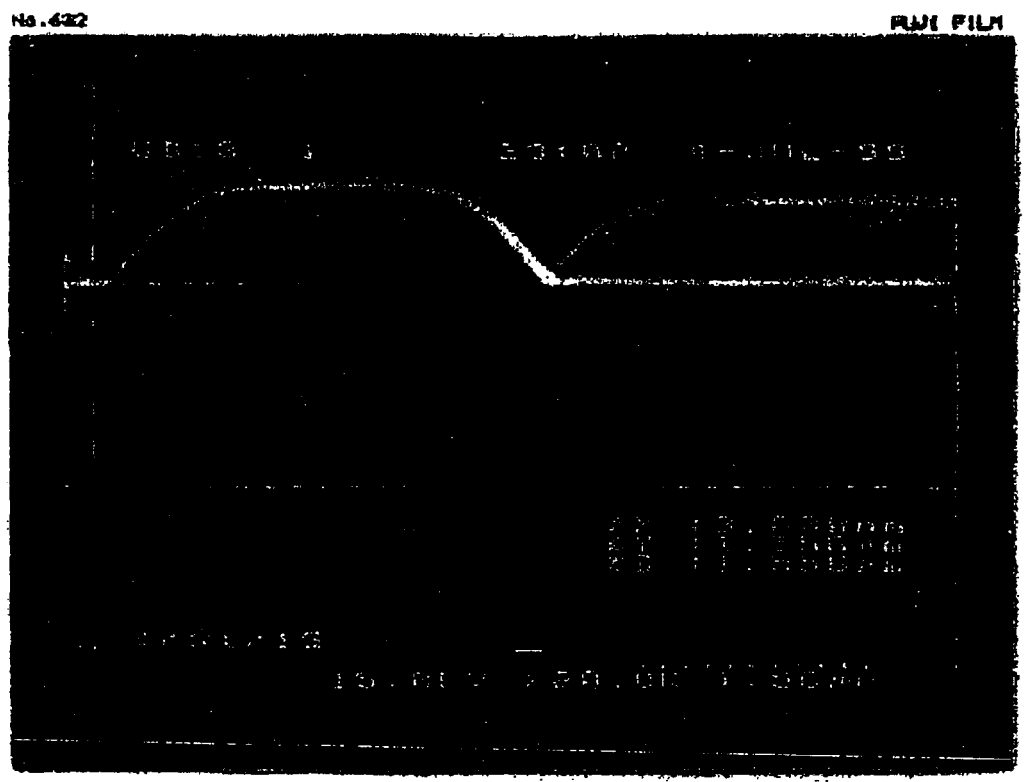
FIG. 11 is an electronic microscope cross section of the wafer measured in FIG. 9.

FIG. 9 illustrates a measured reflection signal from another application, in this measurement a wafer with pattern of metal lines was covered by an inter-metal dielectric on silicon dioxide (Oxide). Two thicknesses of oxide are present within the measurement spot: 1) oxide on top of the metal lines, with $d_2=1556$ nm, and oxide on top of previously deposited dielectric of thickness of $d_1=722$ nm (FIG. 11). FIG. 10 is the signal received after processing by a frequency decomposition process similar to the one presented in FIGS. 12 and 13. The results show the peaks at a frequency related to $d_2$ and $d_1+d_2$.

Figure 12:
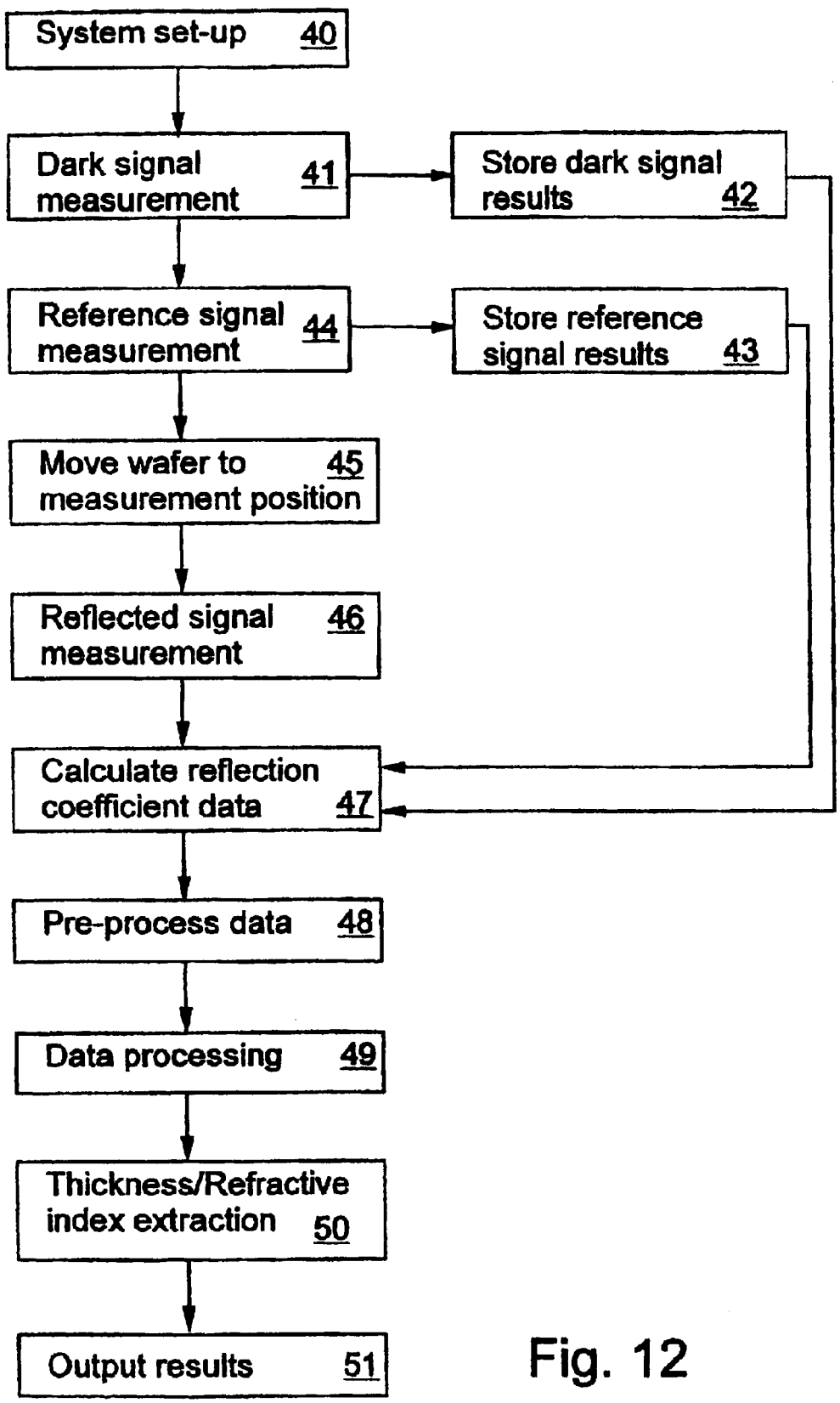
FIG. 12 is a flow chart of the signal processing procedure.
Figure 13:
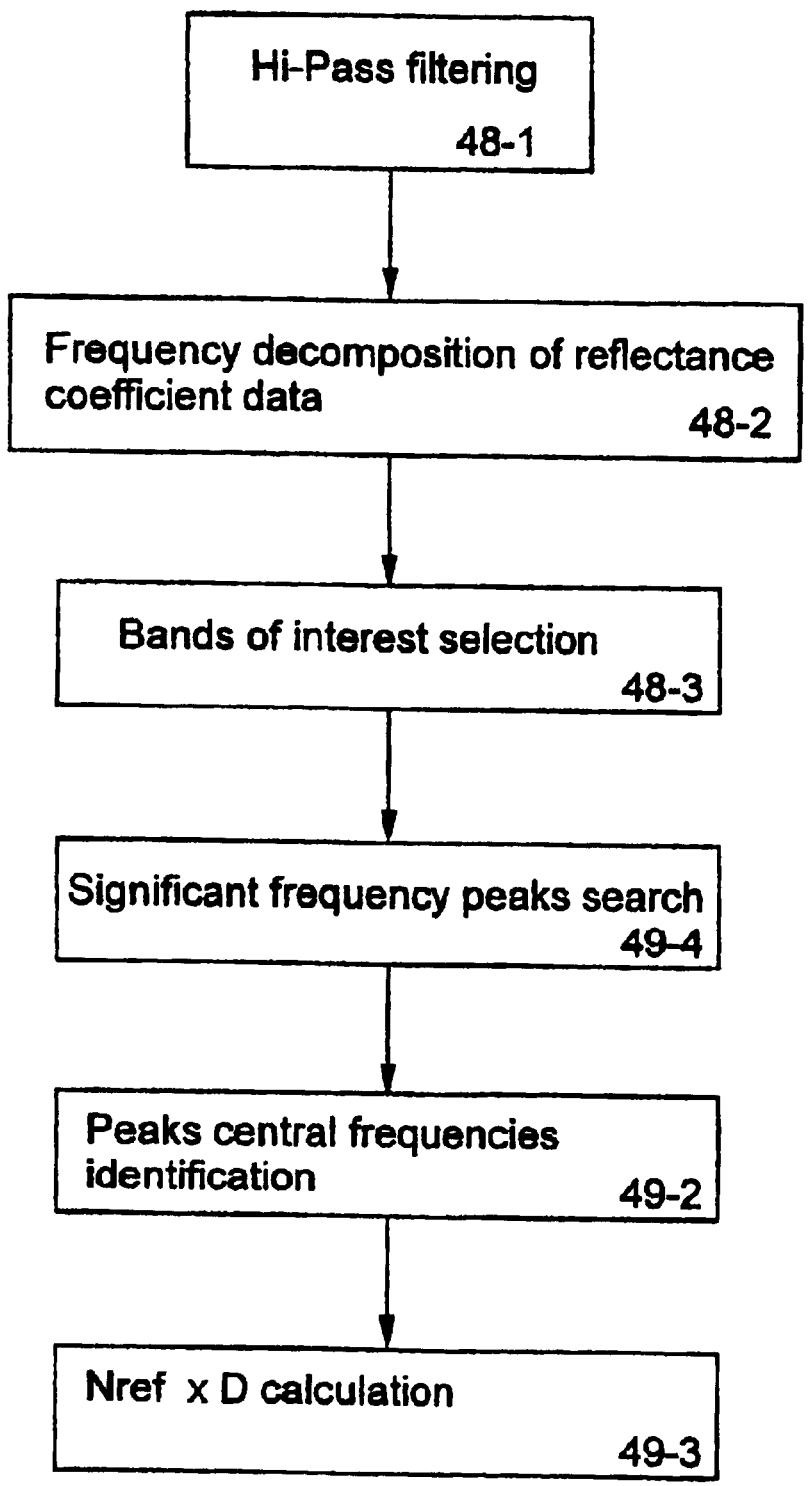
FIG. 13 is a detailed flow chart of the pre-processing and processing stages in FIG. 12.

The flow chart of FIG. 12 illustrates one manner of analyzing the optical signals in above-described apparatus for measuring the thickness/refractive index of a transparent layer. Prior to the actual measurement the system has to be set-up (Block 40) and calibrated. The 'dark signal' is the background signal collected in the system without reflected light (Block 41). The collection of the dark current can be done by placing a fully absorbing plate bellow optical bead 12. The dark signal is stored in the computer memory. The 'Reference signal' is the signal collected in the system from a perfectly reflecting surface (Block 44). This signal can be acquired by placing a mirror or a bare polished silicon wafer below the optical head. The 'Reference signal' is also stored in the computer memory (Block 44). All the steps 41–44 can be done only periodically, as required, and do not have to be repeated before each measurement.

For the actual measurement the wafer has to be placed on its stage 4 below optical head 12 (Block 45). The reflected signal is collected in the system (Block 46) and the reflection coefficient is calculated (Block 47) using:

$$R(\lambda)=(\text{Signal}(\lambda)-\text{Dark}(\lambda))/(\text{Reference}(\lambda)-\text{Dark}(\lambda))$$

Where $R(\lambda)$ is the reflection coefficient as a function of the wavelength, $\text{Signal}(\lambda)$ is the reflected signal from the wafer, $\text{Reference}(\lambda)$ is the reference signal stored in the computer memory and $\text{Dark}(\lambda)$ is the background signal stored in the computer memory.

The signal preprocessing (Block 48) is composed of the following steps: Filtering the signal from its low frequency components (lock 4S1 in FIG. 13). Those frequencies are parasitic. Frequency decomposition (Block 482) is done using the methods mentioned above. Only selected frequencies are of interest and the fine detailed search is done within previously selected frequency windows. (Block 483)

The signal processing (Block 49) is composed of the following steps: The significant peak frequencies are found (Block 49-1) and the frequency at its maximum is identified (Block 49-2). Calculating the refractive index times thickness is performed (Block 49-3) using equation 4. If the refractive index is previously known then the exact thickness can be found and if the thickness is previously known then the refractive index can be found (Block 50). The results are then sent to the computer (Block 51) to be used by the engineers or a feed back data to the process.

Preferably, the measurements should be taken while the wafer is spinning at typical speeds of 3000–5000 r.p.m. For a light spot at the edge of a 300 mm diameter wafer, the linear velocity then is about 70 m/sec. The photoresist thickness on the wafer changes gradually along tenth of mm, therefore an averaged result collected within a 10 mm–20 mm arc is sufficient In order to receive a measurement resolution of 20 mm, the measurement time should be about 0.3 millisecond.

In order to achieve the required speed, it is preferably to use a parallel spectrometer detector 15. Such a spectrometer splits the light to its different wavelengths and directs them to the photodiode array, thereby measuring the intensity of each wavelength in parallel. Adding the detected signals during several cycles can reduce the speed demand of the measurement by a factor of 10/30, and can improve the signal/noise ratio. One of the ways to ensure the collection of the data from the same spot over several rotations can be to illuminate the wafer with a stroboscopic light synchronized to the rotation speed and illuminating the wafer every time the same spot passes under the optical probe. The photoresist thickness may be changing at a rate of tenths of seconds, allowing enough margin for multi-cycle signal collection The rotary encoder 5 of spinner motor 4 would perform tracking of the wafer angular position The above-described method and apparatus may also be used for controlling the removal of a transparent film, e.g., by a reactive gas, by a plasma process, by mechanical polishing (for example, chemical mechanical polishing (CMP)), etc. The removal rate of a film can be controlled by continuously monitoring the thickness of the film in the manner described above during the removal process.

The above-described method and apparatus may also be used for controlling the refractive index of a layer such as low-K dielectric. In applications where the thickness uniformity and repeatability are well within the expected limits, any change of the frequency (fn) is a result of change of the refractive index, which in turn gives valuable information on the layer porosity.

One important application of the present invention is to monitoring the depths of isolation trenches in integrated circuits (IC).

The basic units of ICs are MOS transistors. In a typical IC, large numbers of transistors are printed close to each other. The ever increasing demand for smaller and smaller dies leads IC designers to reduce the gap between the transistors, which increases the chance of electrical leakage between the transistors.

Special techniques have been developed to improve the electrical isolation between the transistors. One of these includes the steps of etching relatively deep trenches between the transistors and filling the trenches with silicon dioxide. The process of filling the trenches includes the steps of depositing a thick layer of silicon dioxide on the wafer and polishing and etching the silicon dioxide down to the surface of the wafer, leaving silicon dioxide only inside the trenches.

The present invention allows the depths of the silicon-dioxide-filled trenches to be measured at any point in the process subsequent to the deposition of the silicon dioxide layer, by measuring the thickness of the silicon dioxide layer at the trenches and away from the trenches. In particular, the present invention enables accurate control of the removal of the silicon dioxide down to the level of the trenches, and also enables measurement of the uniformity of the depths of the trenches.

Other applications of the present invention will be apparent, for example, in the application or removal of inter-metal dielectric layers, applied between two metal layers on a semiconductor substrate, or any other transparent layer, such as poly-imide. The invention could also be used in the application or removal of films on printed circuit boards or flat panel displays.

Further variations, modifications and applications of the invention will be apparent to those skilled in the art.

What is claimed is:

1. A method of measuring lateral variations of a property, selected from the group consisting of thickness and refractive index, of a transparent film, in a patterned area comprising repeated patterning, on a substrate, comprising the steps of:
    (a) illuminating over the patterned area with a beam of light of multiple wavelengths said beam having dimensions to include repeated patterning within an illumination area;
    (b) detecting the intensity of the light reflected over the patterned area for each wavelength;
    (c) producing a signal defining the variation of the intensity of the detected light as a function of the wavelength of the detected light;
    (d) decomposing said signal into principal frequencies thereof;
    (e) determining, from said principal frequencies, values of the property of the transparent film as said property varies laterally over said repeated patterning and
    (f) applying said values to repetitions of said property within said repeated patterning.

2. The method according to claim 1, wherein said film is a transparent coating on a semiconductor substrate.

3. The method according to claim 2, wherein said semiconductor substrate is a die among a plurality of dies carried on a semiconductor wafer.

4. The method according to claim 3, wherein said patterned area is large enough to cover at least one complete die.

5. The method according to claim 1, wherein the intensity of an interference pattern of the light reflected from the upper and lower surfaces of the transparent film is detected for each wavelength.

6. The method according to claim 1, wherein the intensity of the light reflected from the transparent film is detected by a spectrum analyzer having a photodiode detector-for each wavelength.

7. The method according to claim 1, wherein the property of the transparent film is measured in situ in real time with the application of the transparent film to the substrate; and the property measurement is used to control the application of the transparent film to the substrate.

8. The method according to claim 1, wherein the transparent film is a photoresist film applied to a semiconductor substrate during the processing of the semiconductor substrate.

9. The method according to claim 1, wherein the transparent film is an intermetal dielectric layer applied to a semiconductor substrate between two metal layers to dielectrically isolate the two metal layers.

10. The method according to claim 1, wherein the property of the transparent film is measured in situ in real time with the removal of the transparent film from the substrate, and the property measurement is used to control the removal of the transparent film from the substrate.

11. The method according to claim 8, wherein the property of the transparent film is measured in situ in real time with the development of the photoresist, and the property measurement is used to monitor the development rate of the photoresist.

12. The method according to claim 9, wherein the property of the transparent film is measured in situ in real time with the development of the photoresist, and the property measurement is used to monitor the development rate of the photoresist.

13. The method according to claim 10, wherein the property of the transparent film is measured in situ in real time with the development of the photoresist, and the property measurement is used to monitor the development rate of the photoresist.

14. The method of claim 1, wherein said wavelengths are selected from the group consisting of infrared wavelengths, visible wavelengths and ultraviolet wavelengths.

15. The method of claim 1, wherein said decomposing is effected using an orthogonal transformation method.

16. The method of claim 1, wherein said decomposing is effected using a maximum likelihood method.

17. The method of claim 1, wherein said decomposing is effected using a method based on a parametric model.

18. The method of claim 1, wherein said decomposing is effected using a sub-space frequency decomposition method.

19. The method of claim 1, wherein said decomposing is effected by steps including:
   (i) transforming said signal into an electrical signal, and
   (ii) filtering said electrical signal.

20. The method of claim 19, wherein said filtering is effected using a narrow pass filter with a variable central frequency.

21. The method of claim 19, wherein said filtering is effected using a plurality of narrow pass filters of successively higher central frequencies.

22. Apparatus for measuring lateral variations of a property, selected from the group consisting of thickness and refractive index, of a transparent film in a patterned area on a substrate, comprising:
   (a) an illuminating device for illuminating the patterned area over a region comprising repeated patterning with a beam of light of multiple wavelengths, said beam being of such dimension as to encompass said repeated patterning;
   (b) a detector for detecting the intensity of the light reflected from the transparent film for each wavelength; and
   (c) a processor for:
      (i) producing a signal defining the variation of the intensity of the detected light as a function of the wavelength of the detected light,
      (ii) decomposing said signal into principal frequencies thereof, and
      (iii) determining, from said principal frequencies, values of the property of the transparent film as said property varies laterally over said repeated patterning and
      (iv) applying said values to repetitions of said property within said repeated patterning.

23. The apparatus according to claim 22, wherein said detector includes a spectrum analyzer for separating the reflected light into its different wavelengths, and a photodiode array including a photodiode detector for each wavelength.

24. The apparatus according to claim 22, wherein said substrate is a die among a plurality of dies carried on a semiconductor wafer, and said patterned area is large enough to cover a complete die.

25. The apparatus according to claim 22, wherein said detector detects the intensity of an interference pattern of the light reflected from the upper and lower surfaces of the transparent film for each wavelength.

26. The apparatus according to claim 22, wherein said apparatus further comprises:
   (d) a support for supporting said substrate.

27. The apparatus according to claim 26, wherein said apparatus further comprises:
   (e) a rotary drive for rotating said support while the substrate thereon is illuminated by said illuminating device, and while the intensity of the reflected light is detected by said detector.

28. The apparatus according to claim 26, wherein said support is a hot plate.

29. The apparatus as claimed in claim 22, wherein the apparatus further includes a film applicator for applying said transparent film to the substrate, and means for controlling said film applicator in real time in response to the measured thickness of the transparent film.

30. The apparatus according to claim 29, wherein said film applicator applies a photoresist film on a semiconductor substrate.

31. The method of claim 22, wherein said wavelengths are selected from the group consisting of infrared wavelengths, visible wavelengths and ultraviolet wavelengths.

32. The apparatus according to claim 22, wherein said illuminating device includes:
   (i) an optical head, and
   (ii) a mechanism for moving said optical head to scan the transparent film with said beam of light.

33. The apparatus according to claim 22, wherein said illuminating device includes a plurality of optical heads at fixed positions relative to the transparent film.

34. In a process for fabricating integrated circuits on a wafer, wherein trenches are formed on a surface of the wafer and the surface then is covered with an oxide layer that fills the trenches, a method of measuring depths of the trenches, comprising the steps of
   (a) illuminating at least a portion of the oxide layer with a beam of light of multiple wavelengths;
   (b) detecting the intensity of the light reflected from the oxide layer for each wavelength;
   (c) producing a signal defining the variation of the intensity of the detected light as a function of the wavelength of the detected light;
   (d) decomposing said signal into principal frequencies thereof;
   (e) determining from said principal frequencies a first layer depth away from said trenches, and a second layer depth at said trenches, and
   (f) deriving from said first and said second layer depths a trench depth.

* * * * *